(12) United States Patent
Kitano

(10) Patent No.: US 7,245,178 B2
(45) Date of Patent: Jul. 17, 2007

(54) ANALOG FILTER CIRCUIT AND ADJUSTMENT METHOD THEREOF

(75) Inventor: Mayo Kitano, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/600,847

(22) Filed: Nov. 17, 2006

(65) Prior Publication Data

US 2007/0057719 A1    Mar. 15, 2007

Related U.S. Application Data

(63) Continuation of application No. 11/119,921, filed on Mar. 3, 2005, now abandoned.

(30) Foreign Application Priority Data

Jan. 6, 2005    (JP)    ............................. 2005-001559

(51) Int. Cl.
    *H03K 5/00*    (2006.01)
(52) U.S. Cl. ..................... 327/553; 327/557; 327/77
(58) Field of Classification Search ........ 327/552–559, 327/77–79
    See application file for complete search history.

(56) References Cited

U.S. PATENT DOCUMENTS 5,371,803 A    12/1994    Williamson, III 6,538,498 B2    3/2003    Lee et al.
6,791,401 B2    9/2004    Miwa

FOREIGN PATENT DOCUMENTS

| JP | 03121610 A | | 5/1991 |
|---|---|---|---|
| JP | 09-083294 | | 3/1997 |
| JP | 10-013188 A | | 1/1998 |
| JP | 2003078392 A | * | 3/2003 |

* cited by examiner

*Primary Examiner*—Dinh T. Le
(74) *Attorney, Agent, or Firm*—Arent Fox LLP.

(57) ABSTRACT

An analog filter circuit in which filter characteristic deviation can be adjusted with simple circuitry and its adjustment method can be provided. The analog filter circuit includes a low pass filter and a high pass filter and output signals of both filters are input to a comparison and adjustment section from which an adjustment signal is fed back to the low pass and high pass filters and also input to a predetermined-band pass filter having predetermined correlation to the low pass and high pass filters. The low pass and high pass filters are tuned so that the frequency-gain characteristic line in an attenuation band of the low pass filter linearly falls, while that line of the high pass filter linearly rises, both the lines crossing at a reference frequency. When filter characteristic deviation occurs, it is adjusted to compensate gain difference between the output signals produced by filtering the reference signal with a reference frequency and, accordingly, the predetermined-band pass filter is adjusted to its desired filter characteristic.

5 Claims, 12 Drawing Sheets

CIRCUIT BLOCK DIAGRAM SHOWING AN ANALOG FILTER
CIRCUIT COMMON FOR FIRST AND SECOND EMBODIMENTS

PRINCIPLE DIAGRAM OF THE PRESENT INVENTION

CIRCUIT BLOCK DIAGRAM SHOWING AN ANALOG FILTER CIRCUIT COMMON FOR FIRST AND SECOND EMBODIMENTS

CIRCUIT DIAGRAM OF A LOW PASS FILTER (LPF) OF THE FIRST EMBODIMENT $$\left( fCUTL = \frac{1}{2\pi C1 \cdot R1} \right)$$

CIRCUIT DIAGRAM OF A HIGH PASS FILTER (HPF) OF THE FIRST EMBODIMENT $$\left( fCUTH = \frac{1}{2\pi C2 \cdot R2} \right)$$

CIRCUIT DIAGRAM OF A BAND PASS FILTER (BPF) OF THE FIRST EMBODIMENT $$\left( fCUTB1 = \frac{1}{2\pi C3 \cdot R3} , fCUTB2 = \frac{1}{2\pi C4 \cdot R4} \right)$$

CAPACITANCE CHARACTERISTIC OF A VARIABLE CAPACITOR ELEMENT

FIG.8 CIRCUIT DIAGRAM SHOWING AN ILLUSTRATIVE DC CONVERTER CONFIGURATION

FIG.9 CIRCUIT DIAGRAM SHOWING AN ILLUSTRATIVE CONFIGURATION OF A COMPARATOR WHICH CONTROLS THE CAPACITANCE VALUE OF A VARIABLE CAPACITOR ELEMENT

FIG.10 CIRCUIT DIAGRAM OF A LOW PASS FILTER (LPF) OF THE SECOND EMBODIMENT

FIG.11 CIRCUIT DIAGRAM OF A HIGH PASS FILTER (HPF) OF THE SECOND EMBODIMENT

FIG.12 CIRCUIT DIAGRAM OF A BAND PASS FILTER (BPF) OF THE SECOND EMBODIMENT

CIRCUIT DIAGRAM SHOWING AN ILLUSTRATIVE OTA CIRCUIT CONFIGURATION

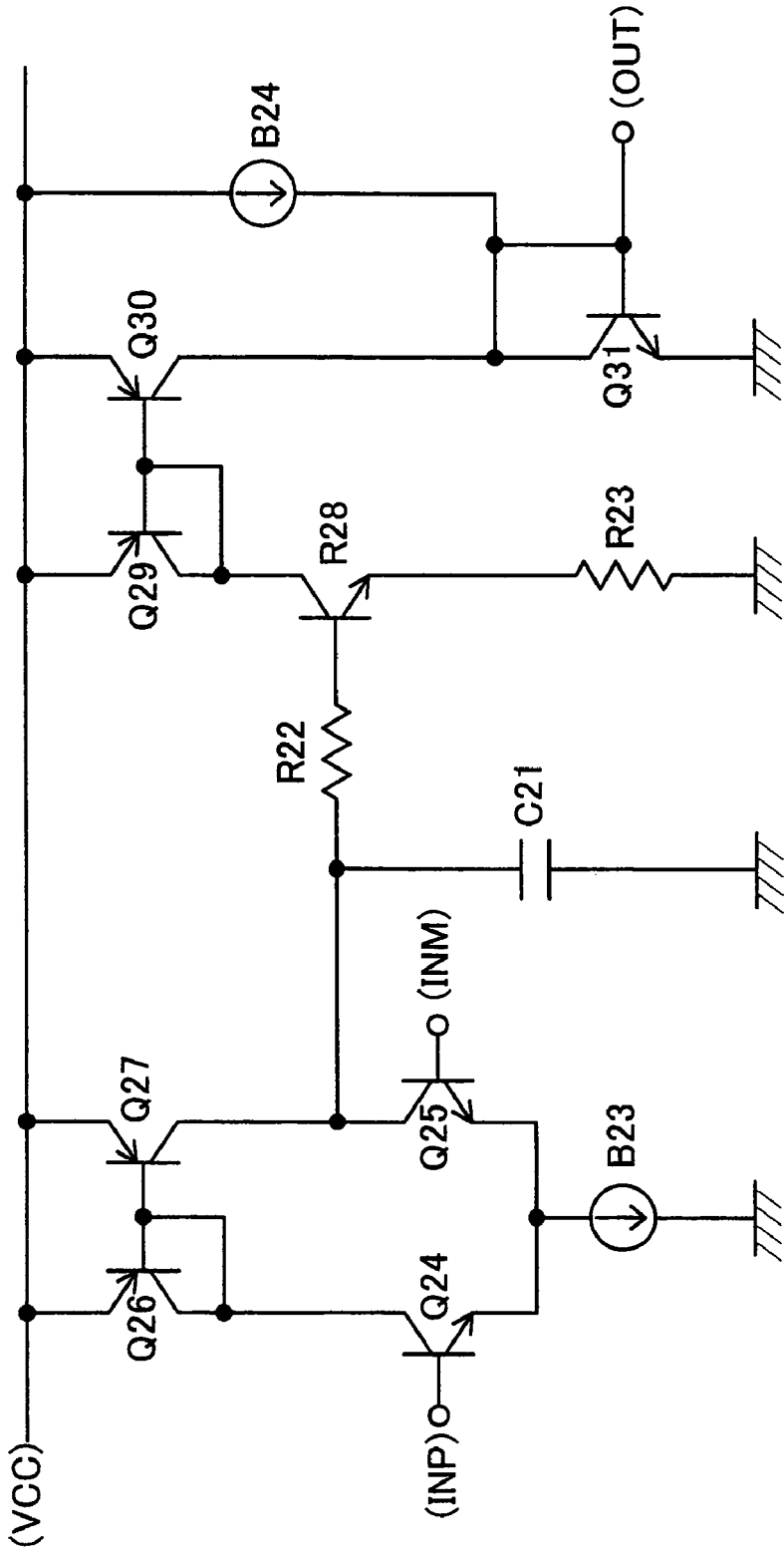
FIG.14 CIRCUIT DIAGRAM SHOWING AN ILLUSTRATIVE CONFIGURATION OF A COMPARATOR FOR CONTROLLING THE GM VALUE OF AN OTA CIRCUIT

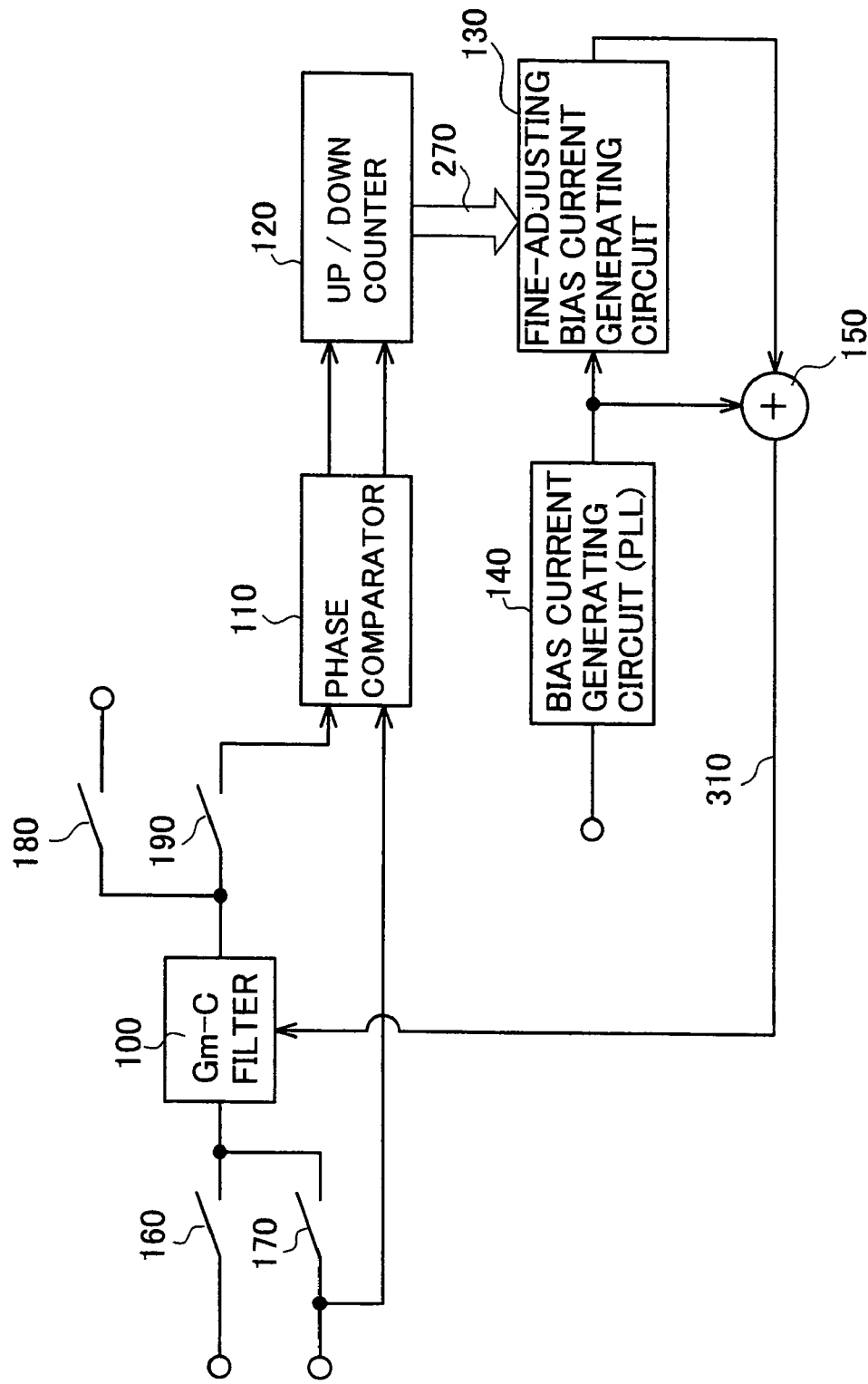
FIG.15 GM-C FILTER CIRCUIT DISCLOSED IN A PRIOR ART REFERENCE

ANALOG FILTER CIRCUIT AND ADJUSTMENT METHOD THEREOF

CROSS-REFERENCE TO RELATED APPLICATIONS

This application is a continuation of U.S. patent application Ser. No. 11/119,921, filed Mar. 3, 2005, now abandoned, which is based upon and claims the benefit of priority from the prior Japanese Patent Application No. 2005-001559 filed on Jan. 6, 2005. The entire contents of which these applications are incorporated herein by reference.

BACKGROUND OF THE INVENTION

1. Field of the Invention

The present invention relates to analog filter circuits and, in particular, to an analog filter circuit capable of automatic adjustment of filter characteristics.

2. Description of Related Art

A Gm-C filter circuit disclosed in Japanese unexamined patent publication No. H09(1997)-83294 is shown in FIG. 15, wherein the Gm-C filter 100 is adjusted by turning the switches 170 and 190 on and the switches 160 and 180 off. When the center frequency of the Gm-C filter 100 is lower than its ideal frequency, the phase of the filter output lags behind the ideal phase. Based on a phase lag signal output from a phase comparator 110, the count value of an up/down counter 120 is incremented by one. The output current of a fine-adjusting bias current generating circuit 130 is determined by the counter output 270 and an adder 150 adds the output current of the fine-adjusting bias current generating circuit 130 to the output current of a bias current generating circuit 140 and outputs the sum as its output current 310. Here, given that the Gm-C filter 100 is designed so that its center frequency increases by an increase of the bias current, the filter is adjusted by the bias current to decrease the phase lag. By repeating the counter action, eventually, the filter center frequency is adjusted to the ideal filter frequency.

SUMMARY OF THE INVENTION

However, the Gm-C filter circuit disclosed in the above prior art publication '294 must be equipped with the up/down counter 120, fine-adjusting bias current generating circuit 130, and adder 150 to detect the phase comparator 110 result and feed back the bias current reflecting the result to the Gm-C filter circuit 100. One problem with such filter circuit is that the need for provision of a large logic circuit such as the up/down counter 120 probably makes an analog filter circuit configuration large and complicated.

When the filter center frequency differs to a large extent from its ideal frequency and must be adjusted, the count value of the up/down counter 120 must be incremented as much as the extent. When filtering a high-frequency signal is adjusted, the up/down counter 120 is required to operate at a higher speed. Another problem is that the up/down counter 120 must be configured in complicated and large circuitry and to meet a higher speed requirement in some situations.

The present invention is made to solve at least one of the above problems associated with filter circuits of the background art and aims to provide an analog filter circuit in which filter characteristic deviation can be adjusted with simple circuitry and a filter adjustment method thereof.

To achieve the purpose above, an analog filter circuit according to one aspect of the present invention comprises a predetermined-band pass filter; a low pass filter and a high pass filter having predetermined correlation to the predetermined-band pass filter in filter characteristics and characterized in that the frequency-gain characteristic line in an attenuation band of the low pass filter linearly falls, while that line of the high pass filter linearly rises, both the lines crossing at a reference frequency; and a comparison and adjustment section which compares output signals from the low pass filter and the high pass filter filtering an input signal with the reference frequency, when gain difference between the output signals is detected, feeds back a signal to the low pass filter and the high pass filter to shift back the crossing point of the characteristic lines toward a direction to compensate the gain difference, and, accordingly, adjusts the predetermined-band pass filter characteristic.

In an analog filter circuit of the present invention, when a predetermined-band pass filter included in the analog filter circuit is adjusted, an input signal with a reference frequency is input to a low pass filter and a high pass filter having predetermined correlation to the predetermined-band pass filter in filter characteristics and characterized in that the frequency-gain characteristic line in an attenuation band of the low pass filter linearly falls, while that line of the high pass filter linearly rises, both the lines crossing at the reference frequency. A comparison and adjustment section compares output signals from the low pass and high pass filters and feeds back a signal to the low pass and high pass filters to shift back the crossing point of the characteristic lines toward a direction to compensate gain difference. Accordingly, the predetermined-band pass filter having the predetermined correlation to the low pass and high pass filters is adjusted.

Furthermore, a method for adjusting an analog filter circuit according to another aspect of the present invention comprises a predetermined-band pass filter and, a low pass filter and a high pass filter having predetermined correlation to the predetermined-band pass filter in filter characteristics and in which the frequency-gain characteristic line in an attenuation band of the low pass filter linearly falls, while that line of the high pass filter linearly rises, both the lines crossing at a reference frequency, the method comprising the steps of: inputting an input signal with the reference frequency to the low pass filter and the high pass filter; comparing output signals from the low pass filter and the high pass filter; feeding back a signal to the low pass filter and the high pass filter to shift back the crossing point of the characteristic lines toward a direction to compensate gain difference; and adjusting the predetermined-band pass filter in accordance with the feeding back.

A method for adjusting the analog filter circuit of the present invention is to input an input signal with a reference frequency to the low pass filter and the high pass filter and compare the output signals from the low pass and high pass filters. In accordance with feeding back a signal to the low pass and high pass filters to shift back the crossing point of the characteristic lines toward a direction to compensate gain difference, the filter characteristic of the predetermined-band pass filter having the predetermined correlation to the low pass and high pass filters is adjusted.

As above, the low pass and high pass filters are tuned so that the frequency-gain characteristic line in an attenuation band of the low pass filter linearly falls, while that line of the high pass filter linearly rises, both the lines crossing at the reference frequency. Even when filter characteristic deviation from a target value occurs due to production variations and for other reason, the comparison and adjustment section can detect gain difference between the output signals from the low pass and high pass filters filtering the reference frequency input signal and determine the deviation from the target value. The comparison and adjustment section feeds back this gain difference to the filters to adjust the filter characteristics of the low pass and high pass filters toward a direction to compensate the gain difference and, accordingly, the filter characteristic of the predetermined-band pass filter is also subjected to change. Because the predetermined-band pass filter has the predetermined correlation to the low pass and high pass filters, by adjusting the filter characteristics of the low pass and high pass filters, the filter characteristic of the predetermined-band pass filter is adjusted accordingly. By compensating the gain difference, the predetermined-band pass filter characteristic is adjusted to the desired characteristic.

The filter characteristics are adjusted by compensating the gain difference and there is no need to detect a phase shift of filter outputs and, consequently, there is no need to provide a large logic circuit such as an up/down counter. The circuitry can be simplified. Provided that gain difference can be detected, filter characteristic deviation can be adjusted, and a range of deviation to be adjusted can be extended with ease. Adjustment of the filter characteristics of filtering the input signal with the reference frequency that differs from the input to the predetermined-band pass filter can be performed. Independent of the frequency of the input signal to the predetermined-band pass filter, the filter characteristics can be adjusted. Frequency characteristic adjustment can be performed with each even for a wide range of adjustment or even when the input signal to the predetermined-band pass filter is a high frequency signal.

In the attenuation band where the crossing of the characteristic lines occurs, the slope of the frequency-gain characteristic line of the low pass filter is opposite to the slope of that line of the high pass filter. For this reason, even a slight shift of the crossing point in frequency relative to the reference frequency can be detected as a large gain difference. Sensitivity of detecting filter characteristic deviation is high and the filter characteristics can be adjusted with high accuracy.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 14 is a circuit diagram showing an illustrative configuration of a comparator for controlling the gm value of an OTA circuit; and FIG. 15 shows a Gm-C filter circuit disclosed in a prior art reference.

DETAILED DESCRIPTION OF THE PREFERRED EMBODIMENTS

Embodiments in which the analog filter circuit and its adjustment method of the present invention are embodied will be described in detail hereinafter with reference to the accompanying drawings, based on FIGS. 1 to 14.

Figure 1:
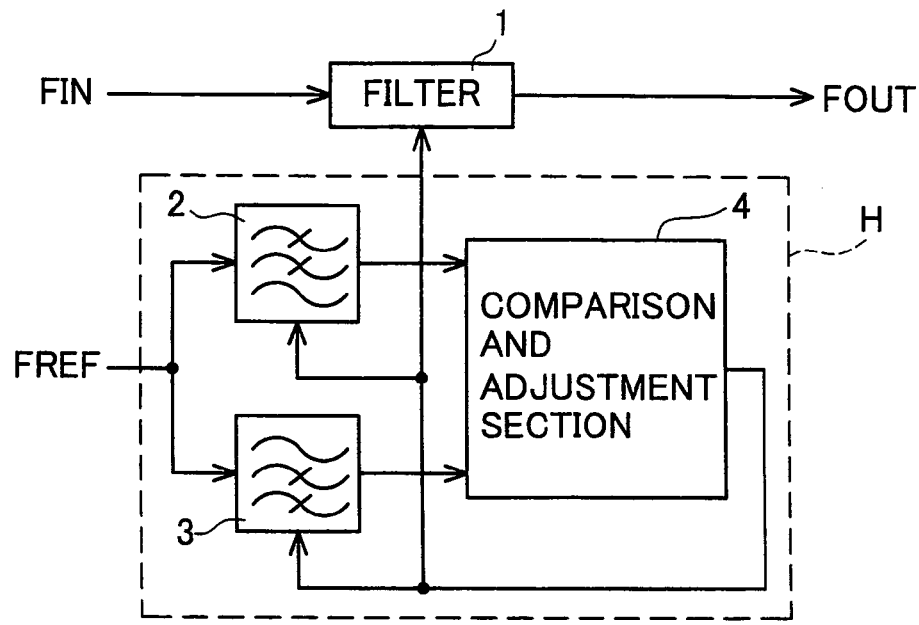
FIG. 1 is a principle diagram to explain the analog filter circuit of the present invention.

FIG. 1 is a principle diagram to explain the analog filter circuit of the present invention. A predetermined-band pass filter 1 which takes an input signal FIN and produces an output signal FOUT is equipped with a correction circuit H for adjusting the filter characteristic. The correction circuit H includes a low pass filter (LPF) 2 and a high pass filter (HPF) 3 and a reference signal FREF with a reference frequency fREF is input to each of these filters. Output signals of the low pass filter (LPF) 2 and the high pass filter (HPF) 3 are input to a comparison and adjustment section 4. An adjustment signal from the comparison and adjustment section 4 is fed back to the low pass filter (LPF) 2 and the high pass filter (HPF) 3 and also input to the predetermined-band pass filter 1 and the characteristics of the filters 1 to 3 are adjusted.

The low pass filter (LPF) 2 and the high pass filter (HPF) 3 are tuned so that the frequency-gain characteristic line in an attenuation band of the low pass filter linearly falls, while that line of the high pass filter linearly rises, both the lines crossing at the reference frequency fREF. When the reference signal FREF with a reference frequency fREF is input to the filters 2 and 3, output signals with the same gain attenuation are output from the filters 2 and 3; in other words, there is no gain difference between them. In this case, the predetermined-band pass filter 1 correlative to the low pass filter (LPF) 2 and the high pass filter (HPF) 3 exhibits a desired filter characteristic.

When the characteristics of the filters 1 to 3 deviate from the setting because of production variations and for other reason, the crossing point of the frequency-gain characteristic lines of the low pass filter (LPF) 2 and the high pass filter (HPF) 3 shifts from the reference frequency fREF. In this state, when the reference signal FREF with a reference frequency fREF is input to the filters 2 and 3, the output signals of the low pass filter (LPF) 2 and the high pass filter (HPF) 3 have different gains, that is, there occurs gain difference between their output signals. In particular, when the crossing point shifts to the high frequency side relative to the reference frequency fREF, the gain of the output signal from the low pass filter (LPF) 2 will be greater than the gain of the output signal from the high pass filter (HPF) 3. Conversely, when the crossing point shifts to the low frequency side, the gain of the output signal from the low pass filter (LPF) 2 will be smaller than the gain of the output signal from the high pass filter (HPF) 3. The comparison and adjustment section 4 detects a gain difference and adjusts the filter characteristics of the low pass filter (LPF) 2 and the high pass filter (HPF) 3 to compensate the gain difference. In correlation to this adjustment, the predetermined-band pass filter 1 is adjusted. With the gain difference compensated by this adjustment, the predetermined-band pass filter 1 is adjusted to exhibit the desired filter characteristic.

Figure 2:
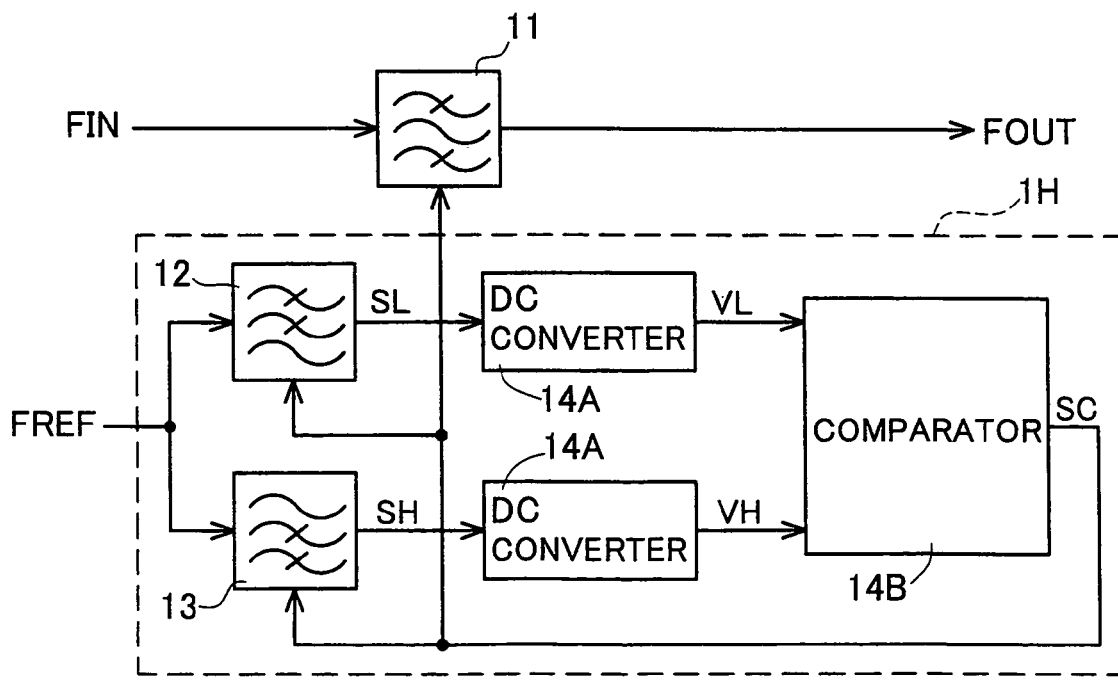
FIG. 2 is a circuit block diagram showing an analog filter circuit common for first and second embodiments.

FIG. 2 is a circuit block diagram showing an analog filter circuit of first and second embodiments. The first and second embodiments will be discussed for an instance where a band pass filter (BPF) 11 is provided as the predetermined-band pass filter which takes the input signal FIN and produces the output signal FOUT.

The comparison and adjustment section is comprised of DC converters 14A and a comparator 14B. Output signals SL and SH from a low pass filter (LPF) 12 and a high pass filter (HPF) 13 are smoothed into DC voltage signals VL and VH through the DC converters 14A provided for each filter and input to the comparator 14B where DC voltage level comparison is performed. From the comparator 14B, an adjustment signal SC is fed back to the low pass filter (LPF) 12 and the high pass filter (HPF) 13 and also input to the band pass filter (BPF) 11 and the characteristics of the filters 11 to 13 are adjusted.

FIGS. 3 through 9 relate to the first embodiment, where the low pass filter (LPF) 12, high pass filter (HPF) 13, and band pass filter (BPF) 11 are configured as passive filters.

Figure 3:
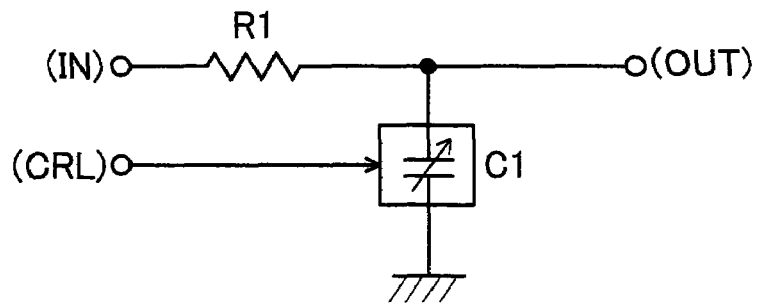
FIG. 3 is a circuit diagram of a low pass filter (LPF) of the first embodiment.
Figure 4:
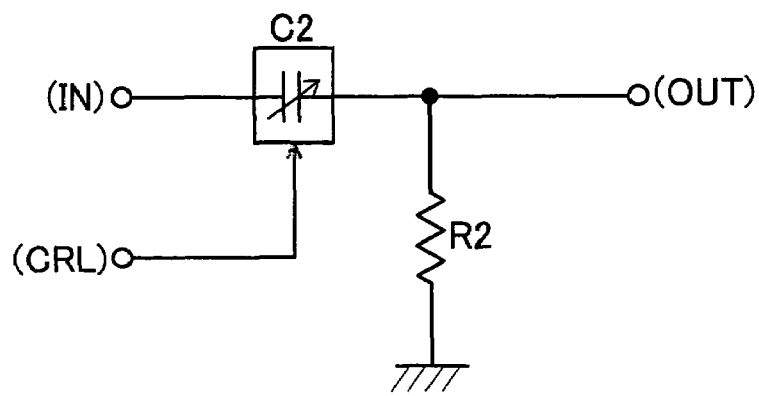
FIG. 4 is a circuit diagram of a high pass filter (HPF) of the first embodiment.
Figure 5:
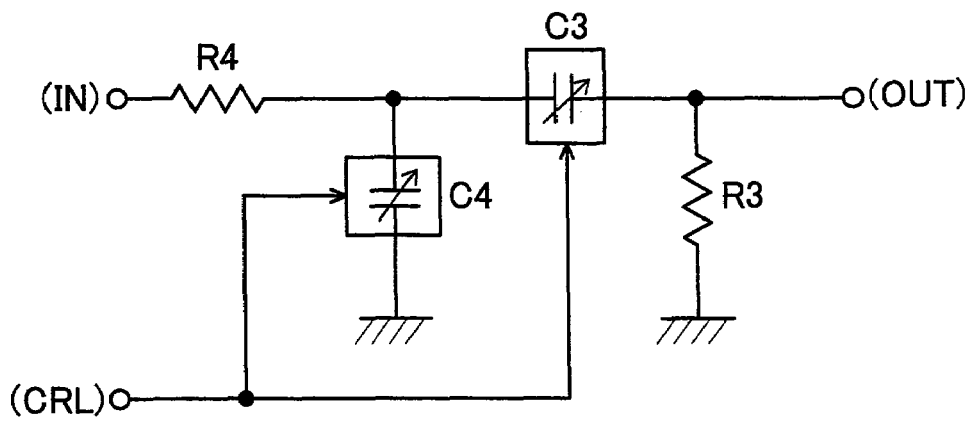
FIG. 5 is a circuit diagram of a band pass filter (BPF) of the first embodiment.

FIGS. 3 through 5 show illustrative configurations equipped with a variable capacitor element for the low pass filter (LPF) 12, high pass filter (HPF) 13, and band pass filter (BPF) 11, respectively. FIG. 3 is an illustrative configuration of the low pass filter (LPF) 12. The LPF is configured with a register element R1 placed between an input terminal (IN) and an output terminal (OUT) and a variable capacitor element C1 placed between the output terminal (OUT) and the ground potential. The capacitance of the variable capacitor element C1 is variably controlled by a voltage level input to a control terminal (CRL).

Given that R1 denotes the resistance value of the resistor element R1 and C1 denotes the capacitance value of the variable capacitor element C1, a cut-off frequency, one of the filter characteristics of the low pass filter (LPF) shown in FIG. 3, is expressed as $fCUTL=1/(2\pi \cdot C1 \cdot R1)$. The LPF is characterized in that the gain for frequencies exceeding the cut-off frequency fCUTL decreases at a slope of $-20$ dB/dec.

As the reference signal FREF with a reference frequency fREF is input to the input terminal (IN) and the output signal SL is output from the output terminal (OUT), when the reference signal FREF frequency exceeds the cut-off frequency fCUTL, the output signal SL attenuated along the slope of $-20$ dB/dec is output. As the capacitance value C1 changes by the adjustment signal SC input to the control terminal (CRL), the cut-off frequency fCUTL changes and the gain of the output signal SL is adjusted.

FIG. 4 is an illustrative configuration of the high pass filter (HPF) 13. The HPF is configured with a variable capacitor element C2 placed between an input terminal (IN) and an output terminal (OUT) and a resistor element R2 placed between the output terminal (OUT) and the ground potential. The capacitance of the variable capacitor element C2 is variably controlled by a voltage level input to a control terminal (CRL).

Given that R2 denotes the resistance value of the resistor element R2 and C2 denotes the capacitance value of the variable capacitor element C2, a cut-off frequency, one of the filter characteristics of the high pass filter (HPF) shown in FIG. 4, is expressed as $fCUTH=1/(2\pi \cdot C2 \cdot R2)$. The HPF is characterized in that the gain for frequencies up to the cut-off frequency fCUTH increases at a slope of $+20$ dB/dec.

As the reference signal FREF with a reference frequency fREF is input to the input terminal (IN) and the output signal SH is output from the output terminal (OUT), when the reference signal FREF frequency is lower than the cut-off frequency fCUTH, the output signal SH attenuated along the slope of $+20$ dB/dec is output. As the capacitance value C2 changes by the adjustment signal SC input to the control terminal (CRL), the cut-off frequency fCUTH changes and the gain of the output signal SH is adjusted.

It should be noted that the cut-off frequency fCUTL of the low pass filter (LPF) and the cut-off frequency fCUTH of the high pass filter (HPF) are fixed by the same equation in which the resistance value R1 or R2 and the capacitance value C1 or C2 are assigned. Thus, as the capacitance values C1 and C2 change by the same adjustment signal SC, both the cut-off frequencies fCUTL and fCUTH can be changed to the same degree.

FIG. 5 is an illustrative configuration of the band pass filter (BPF) 11. The BPF is configured with a resistor element R4 and a variable capacitance element C3 which are connected in series, placed between an input terminal (IN) and an output terminal (OUT), a variable capacitor element C4 placed between a middle point on the line connecting the resistor element R4 and the variable capacitor element C3 and ground potential, and a resistor element R3 placed between the output terminal (OUT) and ground potential. The capacitances of the variable capacitor elements C3 and C4 are variably controlled by a voltage level input to a control terminal (CRL).

Given that R3 and R4 denote the resistance values of the resistor elements R3 and R4 and C3 and C4 denote the capacitance values of the variable capacitor elements C3 and C4, a cut-off frequency, one of the filter characteristics of the band pass filter (BPF) shown in FIG. 5 is expressed as $fCUTB1=1/(2\pi \cdot C3 \cdot R3)$ for the low band and as $fCUTB2=1/(2\pi \cdot C4 \cdot R4)$ for the high band. The BPF is characterized in that the gain for frequencies up to the cut-off frequency fCUTB1 increases at a slope of $+20$ dB/dec and the gain for frequencies exceeding the cut-off frequency fCUTB2 decreases at a slope of $-20$ dB/dec.

The variable capacitor elements C3 and C4 provided in the band pass filter (BPF) 11 have the same element structures and characteristics as the variable capacitor elements C1 and C2 respectively provided in the low pass filter (LPF) 12 and the high pass filter (HPF) 13 and the capacitance values of these capacitor elements change at the same ratio, responsive to the adjustment signal SC input to the control terminal (CRL). Since the cut-off frequencies of all the filters change as a minus first power function depending on the capacitance values C1, C2, C3, and C4 of the variable capacitor elements, the cut-off frequencies change at the same ratio, responsive to change of the capacitance values.

Hence, the cut-off frequencies of all the filters change at the same ratio, responsive to the adjustment signal SC. The filter characteristic deviation of the low pass filter (LPF) 12 and the high pass filter (HPF) 13 is adjusted by the adjustment signal SC that is output, depending on gain difference between the output signals SL and SH produced by filtering the reference signal FREF with a reference frequency fREF. In consequence, the filter characteristic deviation of the band pass filter (BPF) 11 is adjusted correspondingly.

Figure 6:
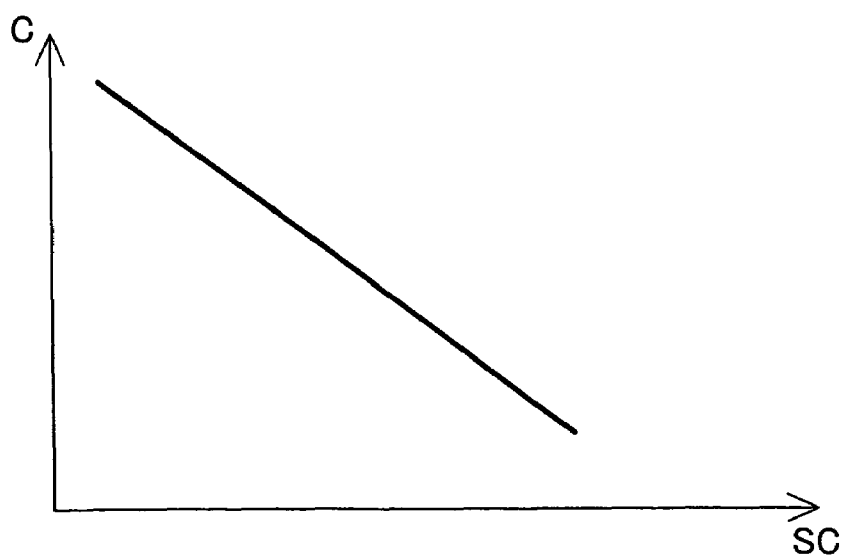
FIG. 6 is a graph showing the capacitance characteristic of a variable capacitor element.

FIG. 6 illustrates the capacitance characteristic of the variable capacitor element versus the adjustment signal SC, where the capacitance value decreases, as the voltage level of the adjustment signal SC increases. By provision of the variable capacitor element having the capacitance characteristic shown in FIG. 6, the characteristics of the filters are adjusted, which is illustrated in FIG. 7.

Figure 7:
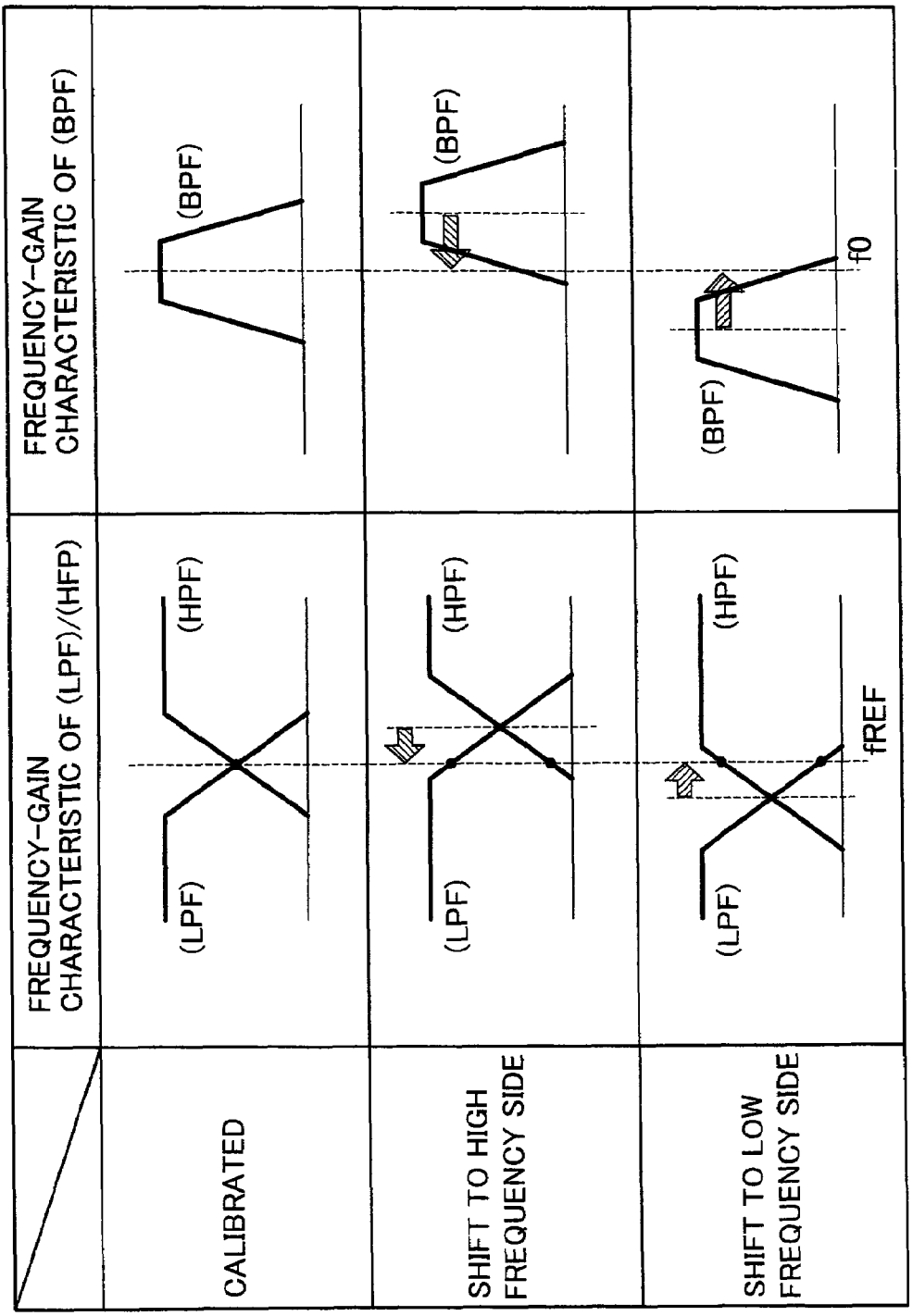
FIG. 7 illustrates correlative filter characteristics and deviation.

In FIG. 7, in the state of the filters calibrated, the falling slope of the frequency-gain characteristic line of the low pass filter (LPF) 12 and the rising slope of that line of the high pass filter (HPF) 13 cross at the reference frequency fREF. At this time, for the filter characteristic of the band pass filter (BPF) 11, the center frequency is calibrated at f0.

When a filter characteristic shift to the high frequency side occurs (in the case of the middle stage in FIG. 7), it is detected that the gain of the output signal SL of the low pass filter (LPF) 12 is greater than the gain of the output signal SH of the high pass filter (HPF) 13 as the result of filtering the reference signal FREF with a reference frequency fREF. In this case, the center frequency of the band pass filter (BPF) 11 also shifts to the high frequency side relative to the frequency f0. According to the capacitance characteristic of the variable capacitor elements shown in FIG. 6, a low voltage level signal as the adjustment signal SC is fed back. As the capacitance values C1 to C4 increase, the cut-off frequencies fCUTL, fCUTH, fCUTB1, and fCUTB2 of the filters 11 to 13 decrease, the filter characteristic deviation is reduced, and the filters are adjusted.

When a filter characteristic shift to the low frequency side occurs (in the case of the lower stage in FIG. 7), it is detected that the gain of the output signal SL of the low pass filter (LPF) 12 is smaller than the gain of the output signal SH of the high pass filter (HPF) 13 as the result of filtering the reference signal FREF with a reference frequency fREF. In this case, the center frequency of the band pass filter (BPF) 11 also shifts to the low frequency side relative to the frequency f0. According to the capacitance characteristic of the variable capacitor elements shown in FIG. 6, a high voltage level signal as the adjustment signal SC is fed back. As the capacitance values C1 to C4 decrease, the cut-off frequencies fCUTL, fCUTH, fCUTB1, and fCUTB2 of the filters 11 to 13 increase, the filter characteristic deviation is reduced, and the filters are adjusted.

Figure 8:
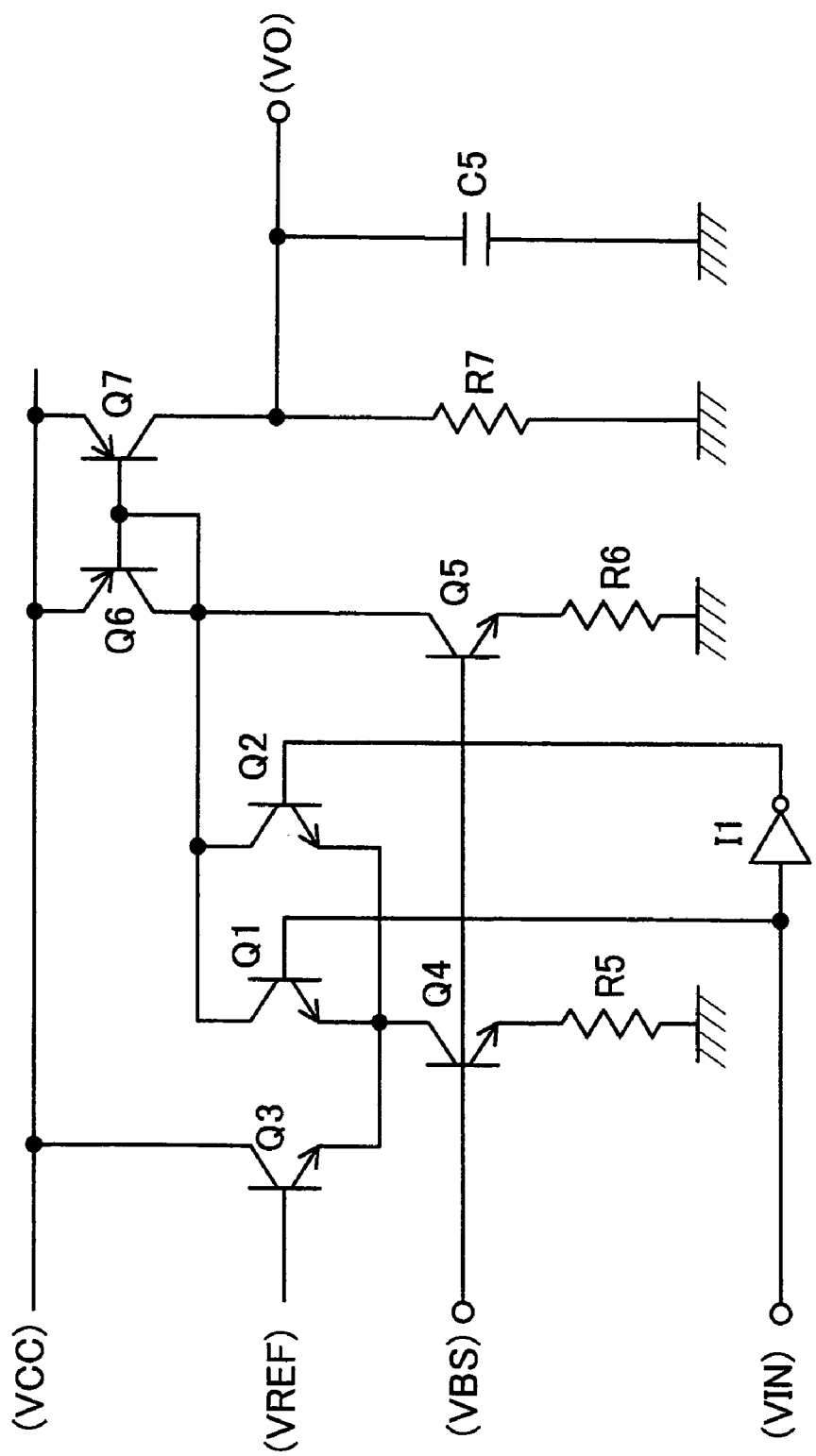
FIG. 8 is a circuit diagram showing an illustrative DC converter configuration.

FIG. 8 shows an illustrative DC converter 14A configuration. The DC converter is a circuit to smooth the output signal SL of the low pass filter (LPF) 12 and the output signal SH of the high pass filter (HPF) 13, which are output as frequency signals, into DC voltage signals.

An input terminal (VIN) at which the output signal SL or SH is input is connected to a base terminal of a transistor Q1 and connected via an inverter I1 to a base terminal of a transistor Q2. Voltage from a reference voltage terminal (VREF) is input to a base terminal of a transistor Q3 with its emitter terminal connecting to a common node to which the transistors Q1 and Q2 also connect. The emitter terminals of the transistors Q1 to Q3 are connected via a transistor Q4 and a resistor element R5 to a ground potential. Both collector terminals of the transistors Q1 and Q2 are connected to a collector terminal of a transistor Q6. The transistor Q6 and a transistor Q7 form a current mirror circuit and the collector terminal of the transistor Q6 is connected to the base terminals of the transistors Q6 and Q7. The collector terminal of the transistor Q6 is connected via a transistor Q5 and a resistor element R6 to a ground potential. The base terminals of the transistors Q4 and Q5 are connected to a bias terminal (VBS) and function as current sources. The collector terminal of the transistor Q7 is connected via a resistor element R7 to a ground potential and its connection point connects to an output terminal (VO). To the output terminal (VO), a smoothing capacitor element C5 is connected.

Through the transistors Q1 to Q3, the output signal SL or SH input at the input terminal (VIN) is compared with a reference signal, not shown, input to the reference voltage terminal (VREF). Because the signal with a voltage level is input to the transistor Q1 and the signal with an inverted voltage level is input to the transistor Q2, every half cycle of the output signal SL or SH input at the input terminal (VIN) and during a period of the voltage level higher than the reference voltage, a bias current from the transistor Q4 flows across either the transistor Q1 or Q2. This bias current is added to a bias current from the transistor Q5 and flows into the transistor Q6. The bias current added together flows through the transistor Q7 by the current mirror circuit and flows into the resistor element R7. After conversion to DC, DC voltage signal VL or VH is smoothed by the capacitor element C5 and output from the output terminal (VO). Voltage amplitude differs depending on the gain of the output signal SL or SH and, accordingly, the period of the voltage higher than the reference voltage differs. In consequence, the DC voltage signal VL or VH with a DC voltage level in proportion to the gain can be produced.

Figure 9:
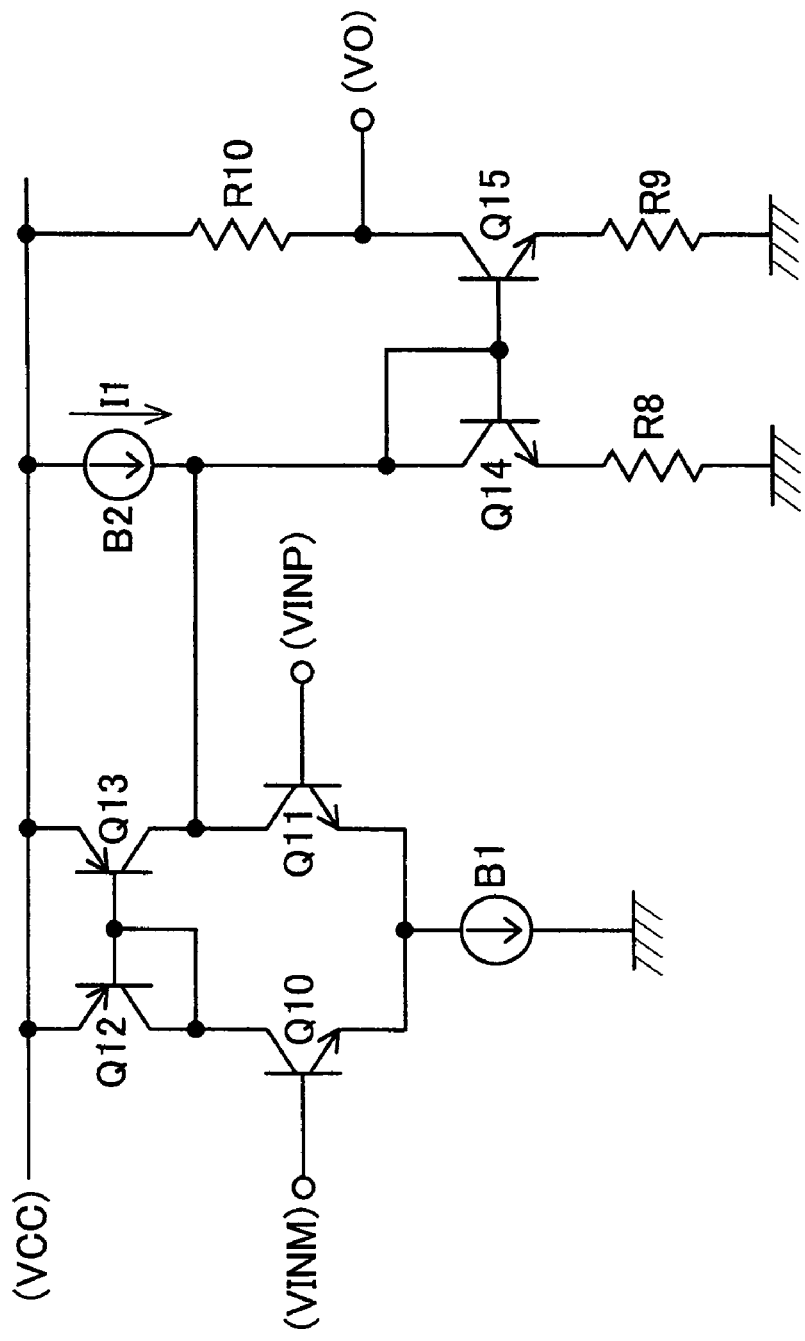
FIG. 9 is a circuit diagram showing an illustrative configuration of a comparator which controls the capacitance value of a variable capacitor element.

FIG. 9 shows an illustrative configuration of the comparator 14B applied in the first embodiment. The comparator is a circuit that takes the inputs of the DC voltage signals VL and VH smoothed and output by the DC converters 14A, compares the DC voltage levels of the signals, and outputs the adjustment signal SC.

An inverting input terminal (VINM) and a non-inverting input terminal (VINP) which are a differential input pair to which the DC voltage signals VL and VH are input are connected, respectively, to base terminals of transistors Q10 and Q11 whose emitter terminals are connected to a common node. Their collector terminals are connected to a current mirror circuit formed by transistors Q12 and Q13 and the emitter terminals are connected via a current source B1 to a ground potential. Base terminals of the transistors Q12 and Q13 connect to a common node and the collector terminal of the transistor Q12 is connected to the base terminals. The collector terminals of the transistors Q12 and Q13 are connected, respectively, to the collector terminals of the transistors Q10 and Q11. A connection point between the transistors Q11 and Q13 is connected to a collector terminal of a transistor Q14. The transistor Q14 and a transistor 15 form a current mirror circuit and the collector terminal of the transistor Q14 and the base terminals of the transistors Q14 and Q15 are connected. Emitter terminals of the transistors Q14 and Q15 are connected via resistor elements R8 and R9 to ground potentials. The collector terminal of the transistor Q14 receives current supplied from a current source B2. The collector terminal of the transistor Q15 is connected via a resistor terminal R10 to a supply voltage (VCC) and also connected to an output terminal (VO).

Now, the response of the comparator shown in FIG. 9 is explained, based on the cut-off frequency characteristics of the filters (FIGS. 3 through 5), the capacitance characteristic of the variable capacitor elements (FIG. 6) and correlative filter characteristics and deviation (FIG. 7).

The case is considered where the voltage level of the DC voltage signal VL is higher than the voltage level of the DC voltage signal VH. In this case, the filter characteristics of the filters 11 to 13 shift to the high frequency side (in the case of the middle stage in FIG. 7). In the comparator of FIG. 9, a bias current from the current source B1 flows mainly through the transistor Q10 and is propagated by the current mirror circuit, added to a bias current from the current source B2, and supplied to the transistor Q14. By the action of the current mirror circuit, an increased current flows across the resistor element R10, a large voltage drop by the resistor element R10 takes place, and the adjustment signal SC with a low voltage level is output from the output terminal (VO). Consequently, the capacitance values of the variable capacitance element increase to shift the cut-off frequency toward the low frequency side, and the filter characteristics are adjusted.

Conversely, the case is considered where the voltage level of the DC voltage signal VL is lower than the voltage level of the DC voltage signal VH. In this case, the filter characteristics of the filters 11 to 13 shift to the low frequency side (in the case of the lower stage in FIG. 7). In the comparator of FIG. 9, the bias current from the current source B1 flows mainly through the transistor Q11 and bypasses the bias current from the current source B2. A less bias current is supplied to the transistor Q14 and, by the action of the current mirror circuit, a reduced current flows across the resistor element R10 and a small voltage drop by the resistor element R10 takes place. The adjustment signal SC with a high voltage level is output from the output terminal (VO). Consequently, the capacitance values of the variable capacitance elements decrease to shift the cut-off frequency toward the high frequency side, and the filter characteristics are adjusted.

FIGS. 10 through 14 relate to the second embodiment, where the low pass filter (LPF) 12, high pass filter (HPF) 13, and band pass filter (BPF) 11 are configured as active filters.

Figure 10:
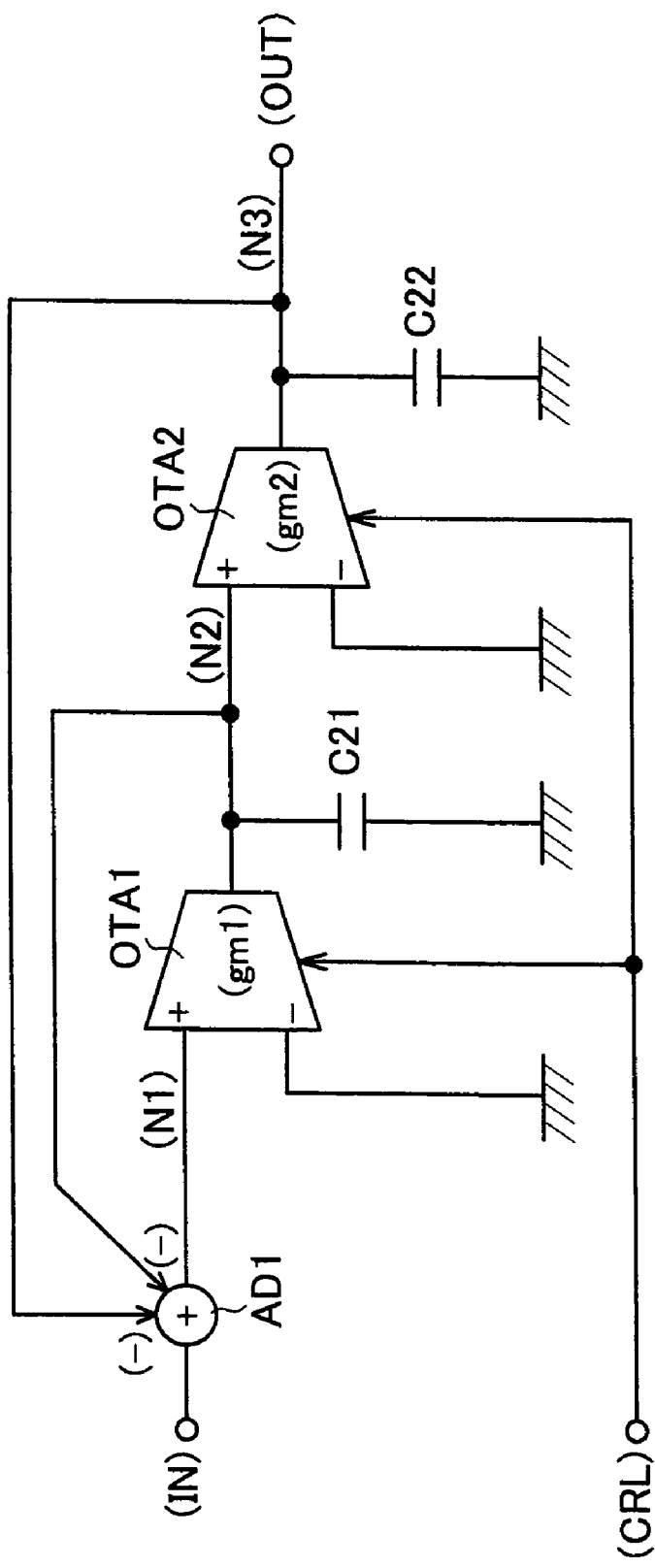
FIG. 10 is a circuit diagram of a low pass filter (LPF) of the second embodiment.
Figure 11:
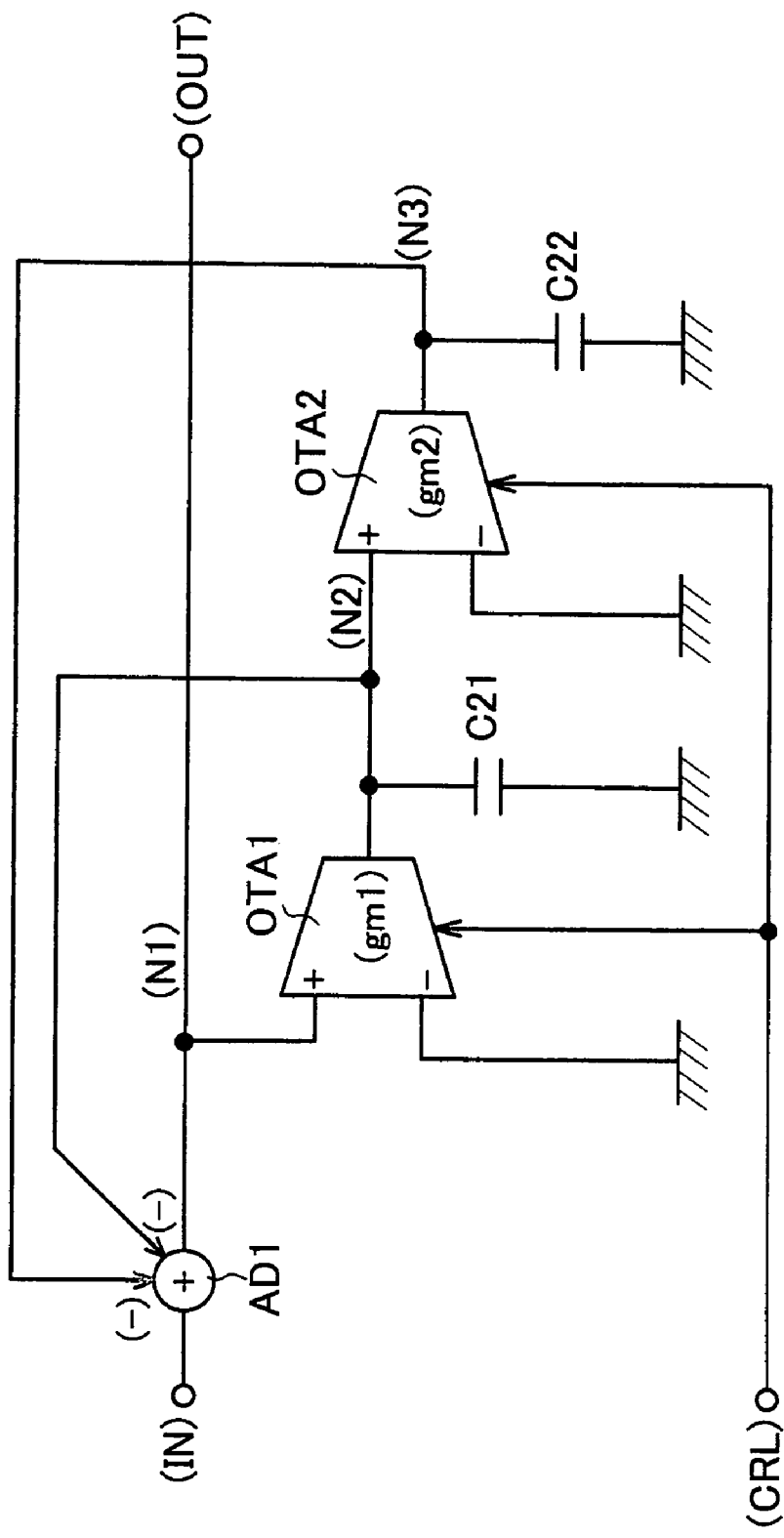
FIG. 11 is a circuit diagram of a high pass filter (HPF) of the second embodiment.
Figure 12:
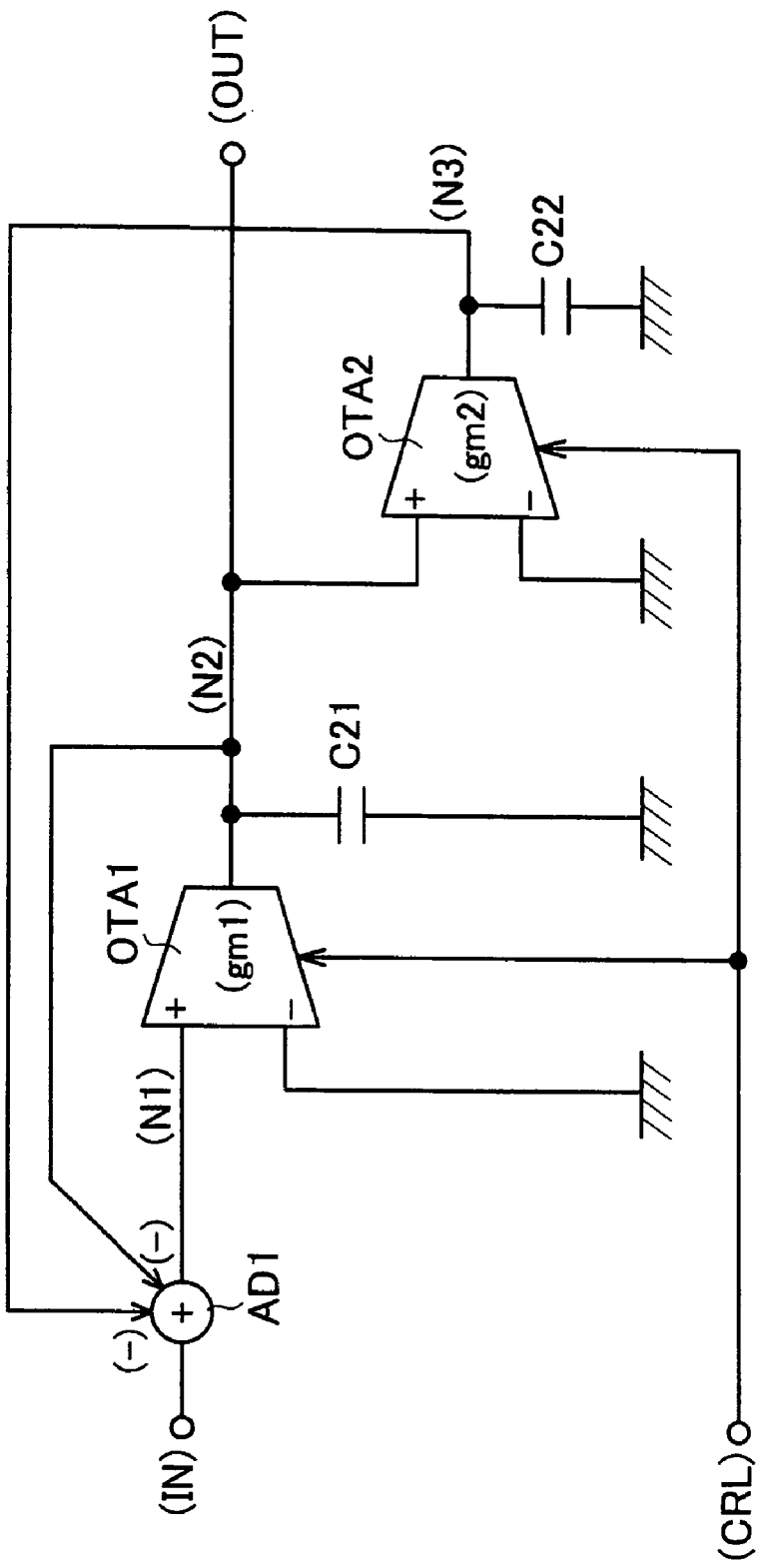
FIG. 12 is a circuit diagram of a band pass filter (BPF) of the second embodiment.

FIGS. 10 through 12 show illustrative configurations of so-called Gm-C filters equipped with trans-conductance amplifiers enabling mutual conductance gm adjustment (hereinafter abbreviated as OTA circuits which stand for operational trans-conductance amplifiers) for the low pass filter (LPF) 12, high pass filter (HPF) 13, and band pass filter (BPF) 11, respectively. These filters have the same structure and the filter characteristic is determined, depending on the position of the node from which the output signal is drawn.

An input terminal (IN) is connected via an adder AD1 and across a node (N1) to a non-inverting input terminal of an OTA circuit OTA1 having mutual conductance gm1. An output terminal of the OTA circuit OTA1 is connected across a node (N2) to a negative feedback terminal of the adder AD1 and also to a non-inverting input terminal of the following-stage OTA circuit OTA2. A capacitor element C21 is connected between the node (N2) and a ground potential. Here, the OTA circuit OTA2 has mutual conductance gm2. An output terminal of the OTA circuit OTA2 is connected across a node (N3) to the negative feedback terminal of the adder AD1. A capacitor element C22 is connected between the node (N3) and a ground potential. Here, the OTA circuits OTA1 and OTA2 have the same circuit structure and characteristic and the capacitor elements C21 and C22 have the same element structure and characteristic. The OTA circuits OTA1 and OTA2 are equipped with a control terminal (CRL) at which the adjustment signal SC is input.

By arranging the OTA circuits and the capacitor elements as above, each filter can be configured, its type depending on the position of the node from which the output signal is drawn. Specifically, as FIG. 10 shows, when the signal path goes across the node (N3) to the output terminal (OUT), the low pass filter (LPF) can be configured. As FIG. 11 shows, when the signal path goes across the node (N1) to the output terminal (OUT), the high pass filter (HPF) can be configured. As FIG. 12 shows, when the signal path goes across the node (N2) to the output terminal (OUT), the band pass filter (BPF) can be configured.

The cutoff frequencies of the filters shown in FIGS. 10 through 12 can be obtained by a widely known derivation method as follows.

For the low pass filter (LPF) of FIG. 10, the cut-off frequency (fCUTL) is expressed by the following equation:

[Equation 1] (1)

$$fCUTL = \sqrt{\frac{2\frac{gm1 \cdot gm2}{C21 \cdot C22} - \frac{gm1^2}{C21^2} + \sqrt{\frac{gm1^4}{C21^4} - 4\frac{gm1^3 \cdot gm2}{C21^3 \cdot C22} + 8\frac{gm1^2 \cdot gm2^2}{C21^2 \cdot C22^2}}}{8\pi^2}}$$

For the high pass filter (HPF) of FIG. 11, the cut-off frequency (fCUTH) is expressed by the following equation:

[Equation 2] (2)

$$fCUTH = \sqrt{\frac{-2\frac{gm1 \cdot gm2}{C21 \cdot C22} + \frac{gm1^2}{C21^2} + \sqrt{\frac{gm1^4}{C21^4} - 4\frac{gm1 \cdot gm2}{C21 \cdot C22} \cdot \frac{gm1^2}{C21^2} + 8\frac{gm1^2 \cdot gm2^2}{C21^2 \cdot C22^2}}}{8\pi^2}}$$

For the band pass filter (BPF) of FIG. 12, the cut-off frequency (fCUTB1, fCUTB2) is expressed by the following equation:

[Equation 3] (3)

$$fCUTB1/fCUTB2 = \sqrt{\frac{2\frac{gm1 \cdot gm2}{C21 \cdot C22} + \frac{gm1^2}{C21^2} \pm \sqrt{\frac{gm1^4}{C1^4} + 4\frac{gm1 \cdot gm2}{C21 \cdot C22} \cdot \frac{gm1^2}{C21^2}}}{8\pi^2}}$$

For any of these filters, the cut-off frequency is expressed as the function of (mutual conductance/capacitance value) $^{(-1)}$. In addition, the OTA circuits OTA1 and OTA2 have the same circuit structure and characteristic and the capacitor elements C21 and C22 have the same element structure and characteristic. Consequently, the cut-off frequencies of the filters change at the same rate, responsive to change of mutual conductance by the adjustment signal SC. Referring to FIG. 2, the filter characteristic deviation of the low pass filter (LPF) 12 and the high pass filter (HPF) 13 is adjusted by the adjustment signal SC that is output, depending on gain difference between the output signals SL and SH produced by filtering the reference signal FREF with a reference frequency fREF. In consequence, the filter characteristic deviation of the band pass filter (BPF) 11 is adjusted correspondingly.

Figure 13:
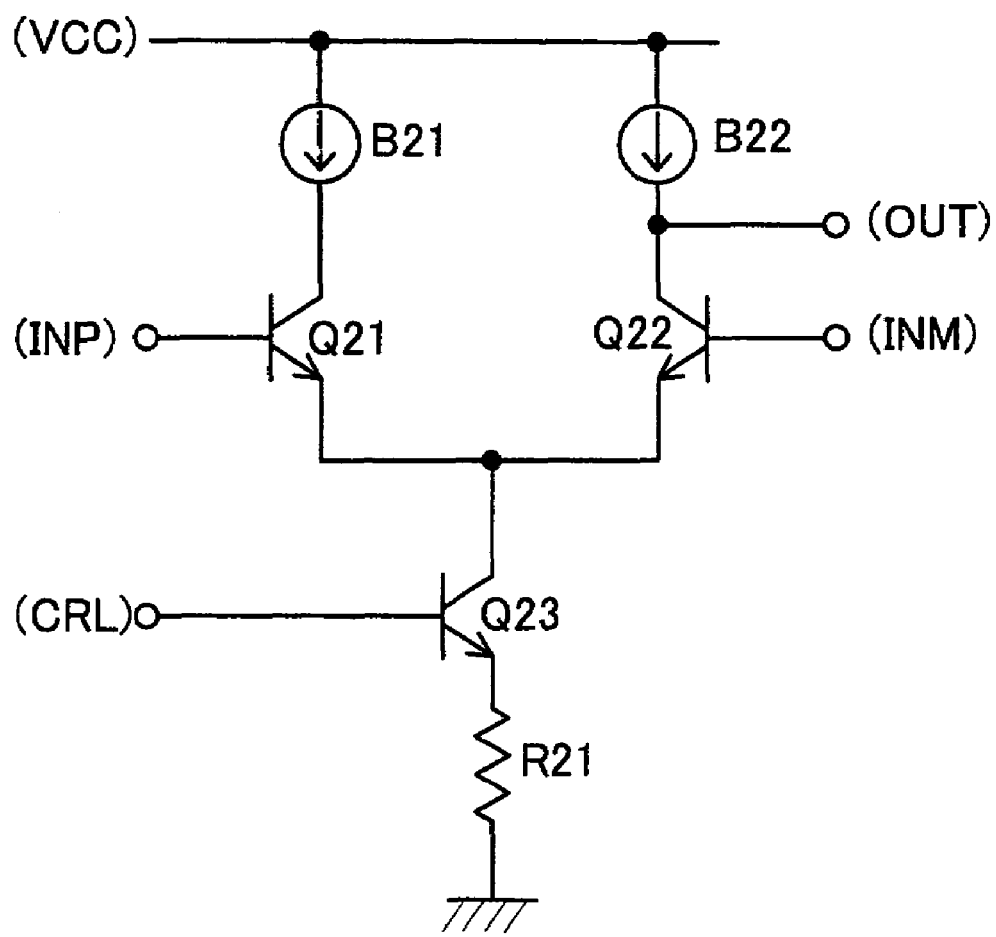
FIG. 13 is a circuit diagram showing an illustrative OTA circuit configuration.

FIG. 13 shows an illustrative OTA circuit configuration. Transistors Q21 and Q22 whose emitters are connected to a common node form a differential pair. A base terminal of the transistor Q21 is connected to a non-inverting input terminal (INP) and a base terminal of the transistor Q22 is connected to an inverting input terminal (INM). Collector terminals of the transistors Q21 and Q22 are connected, respectively, to current sources B21 and B22 and receive current from a supply voltage (VCC). The collector terminal of the transistor Q22 is connected to an output terminal (OUT). The emitter terminals of the transistors Q21 and Q22 connected to the common node are connected via a transistor Q23 and a resistor element R21 to a ground potential. A base terminal of the transistor Q23 is connected to a control terminal (CRL). Depending on the voltage level of the adjustment signal SC input to the control terminal (CRL), a bias current IB flowing across the transistor Q23 is controlled. More specifically, the bias current IB is fixed by applying the adjustment signal SC voltage level less a forward bias voltage by approximately 0.6 V between the base and emitter of the transistor Q23 to the resistor element R21. In other words, the bias current IB is determined in proportion to the adjustment signal SC voltage level.

In the OTA circuit, there is a relationship between the mutual conductance gm and the bias current IB, gm=IB/(4VT); that is, the mutual conductance is controlled in proportion to the bias current IB. Here, VT=k·T/q, where k is a Boltzmann constant, T is absolute temperature, and q is the amount of electron charge. More specifically, under a constant temperature, the mutual conductance gm is proportional to the bias current IB and is controlled in proportion to the adjustment signal SC voltage level.

FIG. 14 shows an illustrative configuration of the comparator 14B applied in the second embodiment. The comparator is a circuit that takes the inputs of the DC voltage signals VL and VH smoothed and output by the DC converters 14A, compares the DC voltage levels of the signals, and outputs the adjustment signal SC.

A non-inverting input terminal (INP) and an inverting input terminal (INM) which are a differential input pair to which the DC voltage signals VL and VH are input are connected, respectively, to base terminals of transistors Q24 and Q25 whose emitter terminals are connected to a common node. Their collector terminals are connected to a current mirror circuit formed by transistors Q26 and Q27 and the emitter terminals are connected via a current source B23 to a ground potential. Base terminals of the transistors Q26 and Q27 connect to a common node and the collector terminal of the transistor Q26 is connected to the base terminals. The collector terminals of the transistors Q26 and Q27 are connected, respectively, to the collector terminals of the transistors Q24 and Q25. A connection point between the transistors Q25 and Q27 is connected via a capacitor element C21 to a ground potential and also connected via a resistor element R22 to a base terminal of a transistor Q28. An emitter terminal of the transistor Q28 is connected via a resistor element R23 to a ground potential and its collector terminal is connected to a collector terminal of a transistor Q29 and base terminals of the transistors Q29 and Q30. The transistors Q29 and Q30 form a current mirror circuit. A collector terminal of the transistor Q30 is connected to collector and base terminals of a transistor Q31 whose emitter terminal is connected to a ground terminal. A current source B24 to which a voltage is supplied from a supply voltage (VCC) is also connected to the collector and base terminals of the transistor Q31 which is connected to an output terminal (OUT). The output terminal (OUT) is connected to the control circuit of the OTA circuit (FIG. 13) and the bias current IB is adjusted, depending on the adjustment signal SC output from the output terminal (OUT). Specifically, the transistor Q31 (FIG. 14) and the transistor Q23 (FIG. 13) form a current mirror circuit and the bias current IB is adjusted, depending on the current flowing across the transistor Q31.

Depending on the adjustment signal SC output from the comparator of FIG. 14, the mutual conductance gm of the OTA circuits in the filters (FIGS. 10 through 12) changes, and the cut-off frequencies (equations (1) through (3)) and the filter characteristics (FIG. 7) are adjusted; details of this adjustment will be explained below.

The case is considered where the voltage level of the DC voltage signal VL is higher than the voltage level of the DC voltage signal VH. In this case, the filter characteristics of the filters 11 to 13 shift to the high frequency side (in the case of the middle stage in FIG. 7). In the comparator of FIG. 14, a bias current from the current source B23 flows mainly through the transistor Q25 and the transistor Q28 is placed in a non-conductive state. No current flows across the current mirror circuit formed by the transistors Q29 and Q30 and only the current source B24 supplies current to the transistor Q31. Current flowing across the transistor Q23 (FIG. 13) is limited to the current from the current source B24 and the bias current IB is limited. The mutual conductance gm is limited to shift the cut-off frequency toward the low frequency side and the filter characteristics are adjusted.

Conversely, the case is considered where the voltage level of the DC voltage signal VL is lower than the voltage level of the DC voltage signal VH. In this case, the filter characteristics of the filters 11 to 13 shift to the low frequency side (in the case of the lower stage in FIG. 7). In the comparator of FIG. 14, the bias current from the current source B23 flows mainly through the transistor Q24 and is propagated by the current mirror circuit, making the transistor Q28 conductive. Current flows across the current mirror circuit formed by the transistors Q29 and Q30 and the current from the transistor Q30 in addition to the current from the current source B24 flows across the transistor Q31. Current flowing across the transistor Q23 (FIG. 13) increase. The mutual conductance gm is increased to shift the cut-off frequency toward the high frequency side and the filter characteristics are adjusted.

As described in detail above, according to the analog filter circuit and its adjustment method in which the present invention is embodied, the low pass filter (LPF) 12 and the high pass filter (HPF) 13 are tuned so that the frequency-gain characteristic line in an attenuation band of the low pass filter linearly falls, while that line of the high pass filter linearly rises, both the lines crossing at the reference frequency fREF. Even when filter characteristic deviation from a target value occurs due to production variations and for other reason, the comparison and adjustment section can detect gain difference between the output signals SL and SH output from the low pass filter (LPF) 12 and the high pass filter (HPF) 13 by filtering the reference signal FREF with a reference frequency fREF and determine the deviation from the target value. The comparison and adjustment section feeds back this gain difference to the filters to adjust the filter characteristics of the low pass filter (LPF) 12 and the high pass filter (HPF) 13 toward a direction to compensate the gain difference. Accordingly, the filter characteristic of the band pass filter (BPF) 11 which is an example of a predetermined-band pass filter is also subjected to change. These low pass filter (LPF) 12, high pass filter (HPF) 13, and band pass filter (BPF) 11 are correlative in predetermined correlation. In these filters, the capacitor elements and/or OTA circuits have the same element structure and characteristics or the same circuit structure and characteristics. In relation to the cut-off frequencies of the filters, capacitance and/or mutual conductance parameters are expressed by the same function, and the cut-off frequencies equally depend on the parameters. Therefore, by adjusting the filter characteristics of the low pass filter (LPF) 12 and the high pass filter (HPF) 13, the filter characteristic of the band pass filter (BPF) 11 is adjusted accordingly. By compensating the gain difference, the band pass filter (BPF) 11 characteristic is adjusted to the desired characteristic.

The low pass filter (LPF) 12 and the high pass filter (HPF) 13 are used in combination and tuned so that the frequency-gain characteristic line in an attenuation band of the low pass filter linearly falls, while that line of the high pass filter linearly rises, both the lines crossing at the reference frequency fREF. Therefore, in the attenuation band where the crossing of the characteristic lines occurs, the slope of the frequency-gain characteristic line of the low pass filter is opposite to the slope of that line of the high pass filter and even a slight shift of the crossing point in frequency can be detected as a large gain difference. Sensitivity of detecting filter characteristic deviation is high and the filter characteristics can be adjusted with high accuracy.

The DC converters 14A are provided to smooth the output signals SL and SH from the low pass filter (LPF) 12 and the high pass filter (HPF) 13 into DC voltage signals VL and VH. The DC voltage signals VL and VH are compared by the comparator 14B and gain difference between the filters can be detected. There is no need to detect a phase shift of the output signals SL and SH and to provide a large logic circuit such as an up/down counter. The DC converter as illustrated in FIG. 8 and the comparator as illustrated in FIG. 9 or 14 can be configured by combining the section for DC voltage comparison using a differential pair or the like and the section for increasing and decreasing the bias current using a current mirror circuit or the like. The circuitry can be simplified.

Adjustment of the filter characteristics of filtering the reference signal FREF with a reference frequency fREF which differs from the input to the band pass filter (BPF) 11 can be performed. Independent of the frequency of the input signal FIN to the band pass filter (BPF) 11, the filter characteristics can be adjusted. Even for the band pass filter (BPF) 11 that filters an input signal FIN of a high frequency bandwidth, the filter characteristic can be adjusted surely. Because filter characteristic deviation is converted to DC voltage values and adjustment is performed, even when the reference signal FREF with a reference frequency fREF has a high frequency, the filter characteristic can be adjusted surely. Frequency characteristic adjustment for a wide range of frequencies can be performed with ease.

It will be appreciated that the present invention is not limited to the foregoing embodiments and various improvements and modifications to those embodiments are possible without departing from its spirit or essential characteristics.

For instance, in the first embodiment, the filters 11 to 13 are configured as passive filters. The filters respectively include the variable capacitor element having the same structure and characteristics and the cut-off frequencies of the filters equally depend on the capacitance value. The characteristics of the filters are adjusted by adjusting the capacitance value. In the second embodiment, the filters 11 to 13 are configured as Gm-C filters. The filters respectively include the OTA circuits having the same structure and characteristics and the cut-off frequencies of the filters equally depend on the mutual conductance gm. The characteristics of the filters are adjusted by adjusting the mutual conductance gm. The present invention is not so limited. In the second embodiment, it may be possible to use variable capacitor element and adjust the capacitance value. Filters may be configured with some other elements and circuits with parameters on which the cut-off frequencies equally depend. For such cases as well, it will be appreciated that the invention can be applied similarly.

In the described embodiments, a predetermined-band pass filter is described as the band pass filter (BPF); however, the present invention is not so limited. Provided that the cut-off frequency of the filter changes in predetermined correlation to the adjustment signal SC, it will be appreciated that the predetermined-band pass filter may be a low pass filter (LPF) or a high pass filter (HPF).

In the described embodiments, by way of illustration, the output signals SL and SH from the low pass filter (LPF) 12 and the high pass filter (HPF) 13 are smoothed into DC voltage signals VL and VH as outputs by the DC converters 14A; however, the present invention is not so limited. Alternative arrangement is possible in which signals corresponding to the gains of the output signals VL and VH are output by observing the peak voltages of the output signals VL and VH, integrating the output signals VL and VH, or other equivalent methods.

According to the present invention, an analog filter circuit in which filter characteristics can be adjusted, depending on gain difference between output signals from a low pass filter and a high pass filter to which a reference frequency signal is input and in which filter characteristic deviation can be adjusted with simple circuitry and a filter adjustment method thereof can be provided.

What is claimed is:

1. An analog filter circuit, comprising:
   a band pass filter;
   a low pass filter and a high pass filter, to which an input signal with a reference frequency is input, the low pass filter and the high pass filter having correlation to the band pass filter in filter characteristics and wherein a frequency-gain characteristic line in an attenuation band of the low pass filter linearly falls, while the corresponding line of the high pass filter linearly rises, both the lines crossing at the reference frequency;
   a pair of DC converters that convert respective filter signals from the low pass filter and the high pass filter to respective DC signals; and
   a comparison section that feeds back an adjustment signal corresponding to a signal level difference between the respective DC signals to the band pass filter, the low pass filter, and the high pass filter, and wherein the pair of DC converters comprise;
   an inverter section that inverts the filter signal;
   a first differential input pair to which the filter signal and a reference signal are input;
   a second differential input pair to which an inversion signal output from the inverter section and the reference signal are input; and
   a converter section that outputs the DC signal according to a signal level difference that the filter signal has with respect to the reference signal, obtained by the first differential input pair, and a signal level difference that the inversion signal has with respect to the reference signal, obtained by the second differential input pair, and
   wherein the adjustment signal compensates a gain difference between the filter signals from the low pass filter and the high pass filter, and accordingly, the filter characteristics in the band pass filter are adjusted.

2. The analog filter circuit according to claim 1, wherein, in each of the band pass filter, the low pass filter, and the high pass filter, at least one component element determining a filter characteristic has the same structure and characteristics as corresponding elements in the other filters, the filter characteristic depends on a component element's parameter value, equally among the three filters, and the component element's parameter value is variably adjusted by the comparison and adjustment section.

3. The analog filter circuit according to claim 2, wherein the band pass filter, the low pass filter, and the high pass filter are passive filters, and wherein the at least one component element includes a variable capacitor element having a variable capacitance value as the component element's parameter value.

4. The analog filter circuit according to claim 2, wherein the band pass filter, the low pass filter, and the high pass filter are active filters, and wherein the at least one component element includes a variable capacitor element having a variable capacitance value as the component element's parameter value and/or a trans-conductance amplifier having a variable mutual conductance as the component element's parameter value.

5. A method for adjusting an analog filter circuit comprising a band pass filter and, a low pass filter and a high pass filter having correlation to the band pass filter in filter characteristics and in which a frequency-gain characteristic line in an attenuation band of the low pass filter linearly falls, while the corresponding line of the high pass filter linearly rises, both the lines crossing at a reference frequency, the method comprising the steps of:

inputting an input signal with the reference frequency to the low pass filter and the high pass filter;

inverting a signal level to output an inversion signal for each of the filter signals that are output from the low pass filter and the high pass filter;

outputting, for each of the filter signals, a DC signal in accordance with a signal level difference that the filter signal has with respect to a reference signal, and a signal level difference that the inversion signal has with respect to the reference signal;

comparing a signal level difference between the respective DC signals output from the filter signals;

feeding back a signal to the low pass filter and the high pass filter to shift back the crossing point of the characteristic lines toward a direction to compensate gain difference between the filter signals in accordance with the signal level difference between the respective DC signals; and adjusting the band pass filter in accordance with the feeding back.

* * * * *

UNITED STATES PATENT AND TRADEMARK OFFICE
CERTIFICATE OF CORRECTION

PATENT NO. : 7,245,178 B2 Page 1 of 1
APPLICATION NO. : 11/600847
DATED : July 17, 2007
INVENTOR(S) : Mayo Kitano It is certified that error appears in the above-identified patent and that said Letters Patent is hereby corrected as shown below:

Title page, item [63]

In the "Related U.S. Application Data":

Delete "Mar. 3, 2005," and substitute therefor -- May 3, 2005 --.

Signed and Sealed this

Thirteenth Day of May, 2008

JON W. DUDAS
*Director of the United States Patent and Trademark Office*